US010234701B2

(12) United States Patent
Morton et al.

(10) Patent No.: US 10,234,701 B2
(45) Date of Patent: Mar. 19, 2019

(54) WAVEGUIDE ARRAY MODULATOR FOR HIGH PERFORMANCE SYSTEMS

(71) Applicant: Morton Photonics, West Friendship, MD (US)

(72) Inventors: Paul A. Morton, West Friendship, MD (US); Jacob Khurgin, Pikesville, MD (US)

(73) Assignee: Morton Photonics, West Friendship, MD (US)

( * ) Notice: Subject to any disclaimer, the term of this patent is extended or adjusted under 35 U.S.C. 154(b) by 4 days.

(21) Appl. No.: 15/787,008

(22) Filed: Oct. 18, 2017

(65) Prior Publication Data

US 2018/0107030 A1    Apr. 19, 2018

Related U.S. Application Data

(60) Provisional application No. 62/409,495, filed on Oct. 18, 2016.

(51) Int. Cl.
*G02F 1/01* (2006.01)
*G02F 1/225* (2006.01)
*H03H 7/38* (2006.01)
*H03H 7/48* (2006.01)
*G02F 1/21* (2006.01)

(52) U.S. Cl.
CPC .......... *G02F 1/0121* (2013.01); *G02F 1/2257* (2013.01); *H03H 7/38* (2013.01); *H03H 7/48* (2013.01); *G02F 2001/212* (2013.01); *G02F 2201/02* (2013.01); *G02F 2201/18* (2013.01); *G02F 2203/58* (2013.01); *G02F 2203/70* (2013.01)

(58) Field of Classification Search
CPC ................. G02F 1/0121; G02F 1/2257; G02F 2001/212; G02F 2201/02; G02F 2201/18; G02F 2203/58; G02F 2203/70; H03H 7/38; H03H 7/48
USPC ............................................................. 385/3
See application file for complete search history.

(56) References Cited

U.S. PATENT DOCUMENTS

| 8,027,587 B1* | 9/2011 | Watts | G02B 6/12007 359/107 |
|---|---|---|---|
| 2005/0147351 A1* | 7/2005 | Johnstone | G02F 1/3133 385/40 |
| 2009/0010592 A1* | 1/2009 | Yamazaki | G02B 6/30 385/14 |
| 2011/0298561 A1* | 12/2011 | Green | G02F 1/0121 333/139 |

* cited by examiner

*Primary Examiner* — Jerry M Blevins
(74) *Attorney, Agent, or Firm* — Nadya Reingand; Yan Hunkin

(57) ABSTRACT

In the Waveguide Array Modulator (WAM) a single electrical signal drives an array of waveguide optical modulators, creating multiple modulated output signals that can be combined to provide a higher output power than from a single waveguide based modulator, enabling a higher dynamic range system. Alternatively, using a WAM in which different waveguide optical modulators are designed for different dynamic ranges, e.g. one highly efficient modulator for low level signals and one low efficiency but linear modulator for high level signals, the WAM based system can provide a higher dynamic range than from a single waveguide based modulator. Various WAM based systems for different applications are included.

20 Claims, 10 Drawing Sheets

WAVEGUIDE ARRAY MODULATOR FOR HIGH PERFORMANCE SYSTEMS

CROSS-REFERENCE TO RELATED APPLICATIONS

This patent application claims priority to the U.S. provisional patent application No. 62/409,495, "Waveguide Array Modulator (WAM) for High Performance Systems", filed on Oct. 18, 2016, fully incorporated herein by reference.

STATEMENT REGARDING FEDERAL SPONSORED RESEARCH AND DEVELOPMENT

This invention was made with U.S. Government support under Contract FA8650-15-C-1863, an Air Force SBIR Project, and the U.S. Government has certain rights in the invention.

FIELD OF INVENTION

This invention relates to high performance active radio frequency (RF) photonics systems and analog photonic links, to high performance RF phased array antenna systems, RF beamforming systems, and RF down-converter and channelizer systems, enabled by photonic integrated circuit (PIC) devices.

BACKGROUND

CMOS foundry based silicon photonics devices provide the opportunity for high volume, low cost devices; ideal candidates for use in RF Photonic systems, analog photonic links, and RF phased array antenna systems—which require processing for 1000's of elements per antenna, supporting the use of large array Photonic Integrated Circuit (PIC) devices. Advances in photonic integration, including heterogeneous integration of III-V materials to fabricate lasers, linear modulators, and photodetectors; ultra-low-loss silicon nitride waveguides for high performance filters and time delay devices; and heterogeneous integration of magneto optic materials to create optical isolators; enable the design and fabrication of complex PIC devices to support a wide variety of RF photonics systems. A key requirement for all of these systems is high linearity, also known as a high operating spurious free dynamic range (SFDR), with a major limitation in obtaining high SFDR being the optical power handling capability and the linearity of integrated optical modulators. The inventions described in this patent overcome the limitations of integrated optical modulators through the use of a parallel array of integrated optical modulators, that are driven with a single RF signal.

SUMMARY

In this invention, a single electrical input is used to drive an array of two or more waveguide based optical modulators, providing multiple modulated outputs, as shown in the schematic and equivalent circuit in FIG. 1A and FIG. 1B. In one version the device maintains the speed of a single modulator by including the multiple waveguide array modulator devices within an impedance matched transmission line, as shown in the schematic and equivalent circuit in FIG. 2A and FIG. 2B. The waveguide array modulator (WAM) has many advantages and applications, including its use to provide modulation with a high power level by combining the output power of the multiple modulator elements, either optically, or through the use of an array photodetector device as a combiner. This approach allows the WAM to generate high power modulated signals as required for high linearity/high SFDR RF Photonic systems, overcoming the limitation of individual semiconductor waveguide based optical modulators which have limited optical power handling capabilities. Alternatively, using a WAM incorporating modulators with different dynamic ranges, such as one very high efficiency modulator and another with much lower efficiency but higher linearity, a system can be developed using this WAM that provides very high linearity/SFDR.

The array modulator approach can be combined with an array of lasers and a photodetector array to meet the high optical power needs to obtain high SFDR in RF Photonic systems, as shown in FIG. 3. The array of lasers may include an array of optical isolators to reduce optical reflections returning into the lasers. In particular, this approach is very well suited to optical integration, where array devices (lasers, modulators and photodetectors) can be easily fabricated at low cost using a single fabrication run. This can provide an integrated photonics solution that has equivalent performance to that obtained with Lithium Niobate external modulators; which have high optical power capability but are prohibitively large in size and high in cost. The array of lasers can be replaced by one, or a smaller number of higher power lasers, each split into two or more signals in order to provide the optical inputs for the WAM.

Each element of the WAM may be one of many types of waveguide optical modulator, including an electro-absorption modulator (EAM), a phase modulator, an amplitude modulator or intensity modulator based on a Mach-Zehnder Interferometer (MZI), a microring resonator based modulator (MRM), or any other form of electro-optic modulator. Additionally, materials for the different modulators include semiconductor waveguide devices utilizing bulk, multiple quantum well (MQW), quantum dash and quantum dot materials, hybrid waveguides such as III-V semiconductors heterogeneously integrated onto silicon waveguides, polymer waveguide modulators and other materials including single atomic layers of graphene, and transition metal dichalcogenides (TMDC), etc.

In applications where the transmitter and receiver are physically separate and should be connected by an optical fiber, wavelength division multiplexing (WDM) can be used to combine the outputs of multiple laser/modulator pairs into a single output, where the lasers are at different WDM wavelengths, and passed through a singlemode fiber and received using a single high power photodetector as shown in FIG. 4A. Further, fully integrated systems such as described in FIG. 3 may include WDM in order to combine many wavelength channels into a single signal before the WDM signal is converted to an electrical signal by a single photodetector.

FIG. 4B shows the case where a single high power laser can be split into two or more signals in order to provide the optical inputs for the WAM. The outputs of each modulator can be phase controlled, either by careful design of the integrated photonic circuit, or through the use of phase tuners (as shown in FIG. 4B) so that the modulated signals can be combined with low loss in a coherent combiner. Due to the phase control of each signal, the effectively lossless combiner can be made from simple directional couplers, MZI structures, a multi-mode interference (MMI) coupler, etc.

In applications where the transmitter and receiver are physically separate and should be connected by an optical fiber, a multi-core optical fiber can be used to connect the output of each array transmit element to the input of each element of an array photodetector as shown in FIG. 5.

The multiple outputs of the array modulator can alternatively be used to feed multiple different systems with the same modulated signal from the single input electrical signal, as shown in FIG. 6. This approach can include providing multiple modulated signals to different systems, the number provided to each system being flexible. Additionally, the multiple signals can be used for separate channels of the same system, such as providing the signals for different antenna elements of a Phased Array Transmit Antenna; in this case the multiple signals will pass through signal processing elements such as phase or time delay, and amplitude control, before being used to provide the signals to the different antenna elements.

An array of modulators driven by the same RF signal can be used to extend the dynamic range (higher SFDR) of the overall system by utilizing optical signals on multiple links, or sub-systems, each with their own limited but different dynamic range, providing much larger dynamic range at the end of the system by appropriate choice of the signal to output, as shown in FIG. 7A. The selected signal can be scaled later in the system based on the dynamic range of the selected signal. An example of this approach is the use of a very high sensitivity EAM for one link, providing high performance for very small RF signals, while using a low efficiency (e.g. a short phase modulation section) MZI modulator with high linearity to provide good performance for very large RF signals. If necessary, other modulators and links can be included in the system to cover different parts of the RF signal dynamic range and increase the system output dynamic range.

FIG. 7B shows schematically the operating principle of a dual channel WAM system incorporating a high efficiency EAM for low level signals (Low Channel) and a low efficiency MZI modulator for high level signals (High Channel). In this schematic the MZI modulator channel, with an SFDR of 112 dB·Hz$^{2/3}$ (or 52 dB in a 1 GHz bandwidth) is used to measure high level RF signals, while the EAM channel, with a much lower SFDR of ~90 dB·Hz$^{2/3}$ (or 30 dB in 1 GHz bandwidth) but also 20 dB higher sensitivity is used to measure low level RF signals. The schematic shows that by combining the two channels, a very high overall SFDR of ~132 dB·Hz$^{2/3}$ (72 dB in 1 GHz bandwidth) can be achieved.

An appropriate choice of which link to use to create the output signal allows for an overall very large dynamic range, i.e. extended SFDR. This choice can be made by monitoring signals levels, either the signal level in the load resistor of the WAM device, or by monitoring the RF signal levels from each photodetector. The resolution required of such monitoring can be very low, only being required to select which output signal to choose. It is also possible to time align the control switching occurring from monitoring the signal level, e.g. the signal from the load resistor of the WAM device and the associated switching event can be time aligned by including the appropriate delay in the optical lines connecting the waveguide optical modulators to the photodetectors.

The RF output signals from the different channels in FIG. 7A, with different dynamic ranges, can be converted to digital signals with multiple analog to digital converters (ADCs), as shown in FIG. 8, and digital signal processing can be carried out on the multiple input channels to provide an output channel with higher dynamic range (SFDR) than each of the input channels. In its simplest form, with a low signal level and high signal level channel (as described previously), the digital processor will choose the low level digital output when the signal level is small and then use a scaled version of the high level digital output when the signal level is larger, therefore creating overall an output signal with more digital bits and higher dynamic range. The choice of signal to choose for the output can be done digitally by analyzing the digital signals, or using the same scheme described for the analog system in FIG. 7A.

More than two channels can be used to expand the dynamic range, as necessary. A very high sensitivity channel can be developed using a high sensitivity modulator, such as an EAM or an MRM, followed by an optical amplifier such as a semiconductor optical amplifier (SOA); in this case the nonlinearity of the SOA, which is often a concern, is not relevant due to the very small level of RF signal being sensed by this link. As an example, and shown in FIG. 9, there are four modulators and links, a very high sensitivity channel with an EAM and SOA, a high sensitivity channel with an EAM, plus two more linear channels, one with a standard MZI modulator for linear performance and typical sensitivity, and one with a very low sensitivity MZI modulator (very short phase modulation sections or low index change per voltage design; low δn/δV). The four photodetector RF outputs in FIG. 9 can be selected or processed to provide a single very high dynamic range output using analog and/or digital techniques. While this device has more components and is more complex than using a single modulator based link, it can be fabricated in large scale at low cost using photonic integration.

The array modulator approach can be utilized in RF Photonic Links, and also in more complex photonic systems with additional photonic components in the link, such as optical filters, time delay, switches, optical amplification, optical wavelength division multiplexers and demultiplexers, and RF Photonic Links that include optical down-conversion, such as shown in FIG. 10. Two parallel systems, e.g. for optical down-conversion; one for high level signals (High Channel) and one for low level signals (Low Channel), can be used to provide an overall very high system SFDR; using ADCs on the outputs of the two down-converted signals, the system output can be calculated digitally after analyzing the two digital down-converted outputs, to provide the high SFDR system output. In this case, complex input signals including both high and low level RF signals can be analyzed through digital signal processing to provide an accurate measure of all input signals over an extremely wide dynamic range; analysis of any large RF signals (in the High channel) will provide values for any intermodulation products due to them that would be seen in the Low channel, so they can be removed from the measured spectrum.

DETAILED DESCRIPTION OF THE PREFERRED EMBODIMENTS

Figure 1A:
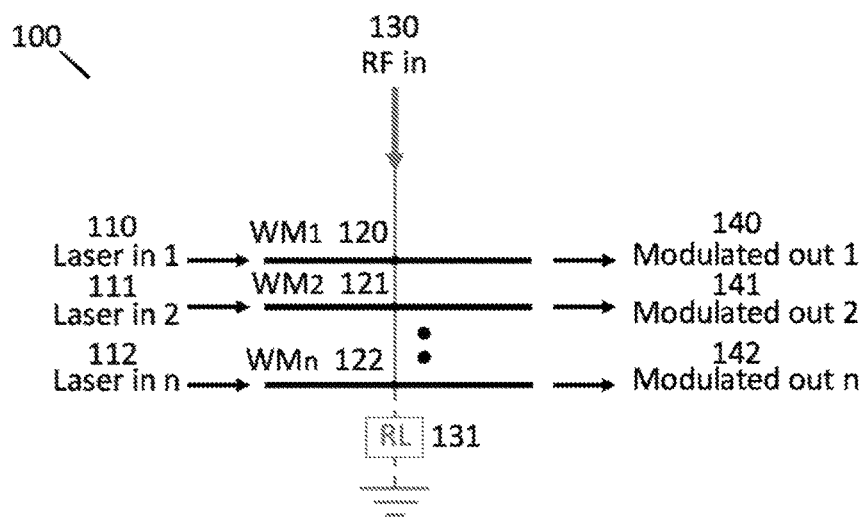
FIG. 1A A schematic of the direct drive version of the waveguide array modulator (WAM) device FIG. 1B An electrical equivalent circuit of the direct drive waveguide array modulator (WAM) device.

FIG. 1A shows an embodiment of the basic waveguide array modulator (WAM) 100. The WAM is made up of N waveguide optical modulators, in FIG. 1A and other figures typically depicted by 3 waveguide optical modulators for simplicity, however it can be any number; 120, 121 and 122, connected electrically to each other so that the RF input signal 130 connects to all the waveguide optical modulators, and to a load resistance 131. A series of N laser inputs, in FIG. 1A and other figures typically depicted by 3 lasers for simplicity, however it can be any number; 110, 111 and 112, are input to the N modulators, which apply a modulation to the N laser inputs based on the RF input signal 130. The output of the WAM is made up of N modulated optical signals, shown as 140, 141, 142 in FIG. 1A.

Figure 1B:
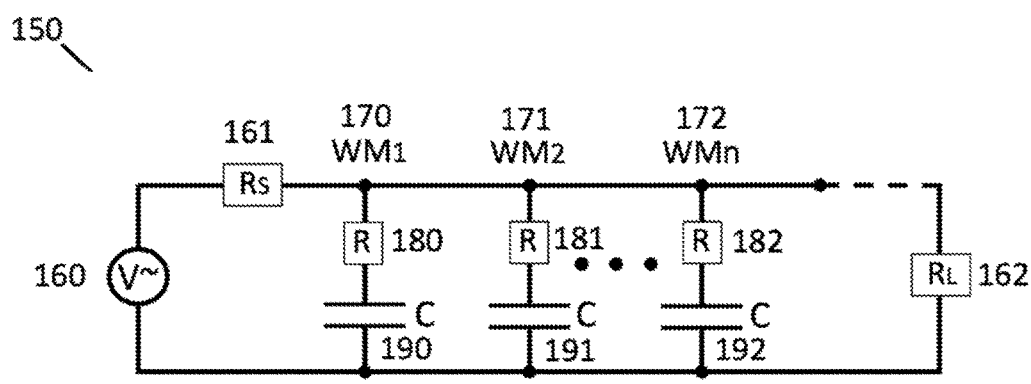

FIG. 1B shows an electrical equivalent circuit for the WAM 150 from FIG. 1A. The RF input signal is denoted by an RF voltage source 160 with its series resistance 161. The RF input signal is applied to all N waveguide optical modulators, 170, 171 and 172 in FIG. 1B, and also to the load resistance 162. The equivalent circuit of each of the waveguide optical modulators is a resistor in series with a capacitor, so that for waveguide optical modulator 170 its equivalent circuit is resistor 180 and capacitor 190, similarly for waveguide optical modulator 171 (181, 191) and 172 (182, 192).

Figure 2A:
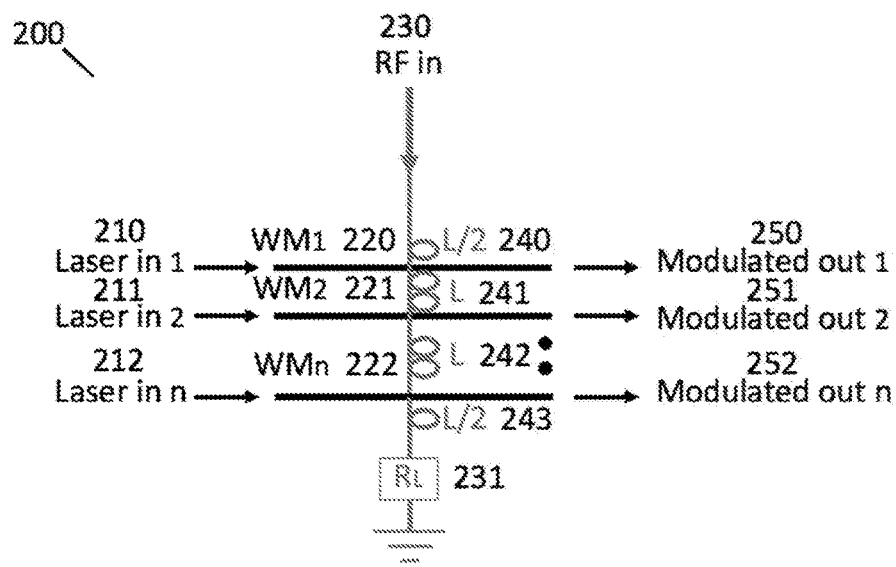
FIG. 2A A schematic of the waveguide array modulator (WAM) device within a transmission line.

An embodiment of the WAM in which the waveguide optical modulators are connected to each other, and to the RF input signal and load resistor by inductors, in order to create an artificial transmission line, is shown in FIG. 2A 200. N waveguide optical modulators 220, 221 and 222 are connected to each other by inductors of value L, shown as 241 and 242, the first waveguide optical modulator 220 connected to the RF input signal 230 by an inductor of value L/2 240, the last waveguide optical modulator 222 connected to the load resistor 231 by an inductor of value L/2 243. The value for L is calculated from the equation $Z=\sqrt{L/C}$; where Z is the artificial transmission line impedance and C the capacitance of a waveguide optical modulator. In FIG. 2A, N lasers 210, 211 and 212 provide the inputs to the waveguide optical modulators 220, 221 and 222, which modulate the laser inputs based on the RF signal input and provide N modulated optical outputs 250, 251 and 252.

Figure 2B:
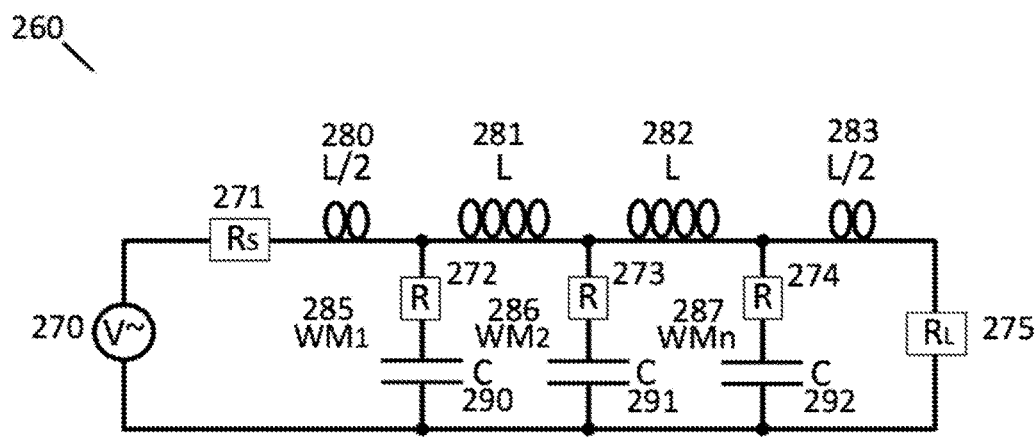
FIG. 2B An electrical equivalent circuit of the waveguide array modulator (WAM) device within a transmission line.

FIG. 2B shows an electrical equivalent circuit for the WAM 260 from FIG. 2A. The RF input signal is denoted by a voltage source 270 with its series resistance 271. The RF input signal is applied to the first waveguide optical modulator 285 through an inductor L/2 280, then the second waveguide optical modulator 286 through an inductor L 281, to the Nth waveguide optical modulator 287 through an inductor L 282, then the load resistance 275 through an inductor L/2 283. The equivalent circuit of each of the waveguide optical modulators is a resistor in series with a capacitor, so that for waveguide optical modulator 285 its equivalent circuit is resistor 272 and capacitor 290, similarly for waveguide optical modulators 286 (273, 291) and 287 (274, 292).

Figure 3:
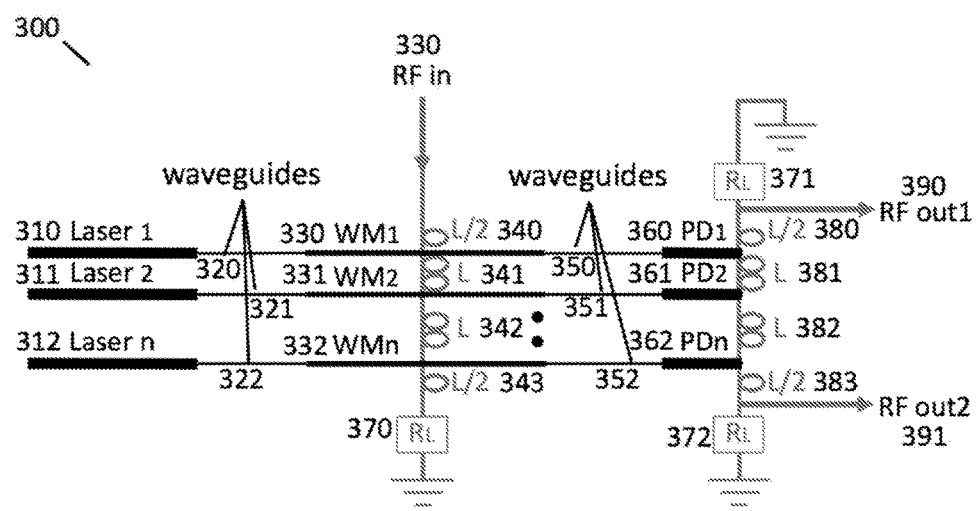
FIG. 3 A schematic of the fully integrated array approach; laser array, waveguide array modulator (WAM), array photodetector.

An embodiment of the WAM based system within a photonic integrated circuit (PIC), which includes integrated lasers and an integrated array photodetector, all interconnected by optical waveguides, is shown in FIG. 3 300. The N waveguide optical modulators 330, 331 and 332 are connected by optical waveguides 320, 321 and 322, to N lasers 310, 311 and 312. The RF input signal 330 is applied to the N waveguide optical modulators through the series of inductors 340, 341, and 342, then connected to the load resistance 370 through inductor 343. The modulated outputs of the N waveguide optical modulators pass through N optical waveguides 350, 351 and 352, and into an integrated array photodetector made up of N photodetectors; in FIG. 3 and other figures typically depicted by 3 photodetectors for simplicity, however it can be any number; 360, 361 and 362. The array photodetector is itself arranged as an artificial transmission line with load resistors 371 and 372 at the ends of the transmission line, the transmission line itself being made up of the photodetectors which act mainly as capacitors, and inductors 380, 381, 382 and 383 which match the capacitances of the photodetectors to make up the artificial transmission line. RF outputs can be taken from across the two load resistors 371 and 372, providing RF output 1; 390 and RF output 2; 391.

Figures 4A, 4B:
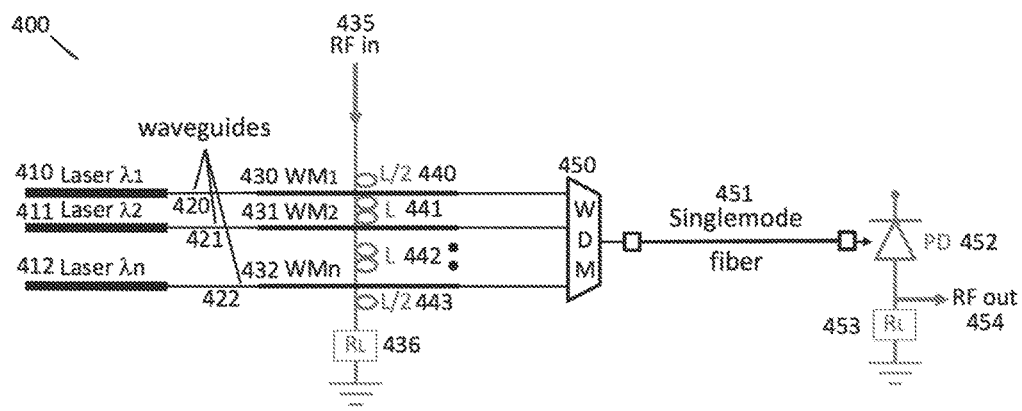
FIG. 4A The use of wavelength division multiplexing (WDM) to support a single optical fiber plus a single photodetector.
FIG. 4B A single high power laser split between multiple modulators, combined with low loss through control of the optical phase of each modulator output, supporting a single optical fiber plus a single photodetector.

An embodiment of a WAM based system utilizing wavelength division multiplexing 400 to provide outputs from the N waveguide optical modulators into one singlemode optical fiber, which can transport the modulated optical signals to a separate and potentially remote, single, high-power photodetector, is shown in FIG. 4A. In this embodiment, the N waveguide optical modulators 430, 431 and 432 are connected by optical waveguides 420, 421 and 422 to N lasers 410, 411, 412 that each have a different optical wavelength. The RF input signal 435 is applied to the N waveguide optical modulators that are incorporated into an artificial transmission line through the series of inductors 440, 441, and 442, connected to the load resistance 436 through inductor 443. The modulated outputs of the N waveguide optical modulators pass through optical waveguides into a wavelength division multiplexer (WDM) 450, which combines the signals at different wavelengths from the different waveguide optical modulators and wavelength specific lasers, providing a single output to a singlemode fiber 451, which provides the wavelength division multiplexed modulated signals to a single, high-power photodetector 452. The output current from the photodetector 452 into its load resistor 453, provides an RF output signal 454 from the voltage across the load resistor.

In another embodiment of a WAM based system shown in FIG. 4B, a single high power laser is split to provide N optical signals into the N waveguide optical modulators, and the outputs of the waveguide optical modulators are passed through phase controllers before being coherently combined 460. This approach overcomes the limited power handling capability of a single waveguide optical modulator. In this embodiment the output is again into a singlemode fiber, to allow transmission of the signal to a separate, single, high-power photodetector. The output of a high power laser 470 is split into N optical signals in a splitter 471, that pass into N waveguide optical modulators 472, 473 and 474. The RF input signal 480 is applied to the N waveguide optical modulators that are incorporated into an artificial transmission line through the series of inductors 481, 482, and 483, connected to the load resistance 485 through inductor 484. The outputs of the N waveguide optical modulators pass through N optical phase control element 486, 487 and 488, before being coherently combined in combiner element 490, providing a single output to a singlemode fiber 491, which provides the modulated signal to a single, high-power photodetector 492. The output current from the photodetector 492 into its load resistor 493, provides an RF output signal 494 from the voltage across the load resistor.

Figure 5:
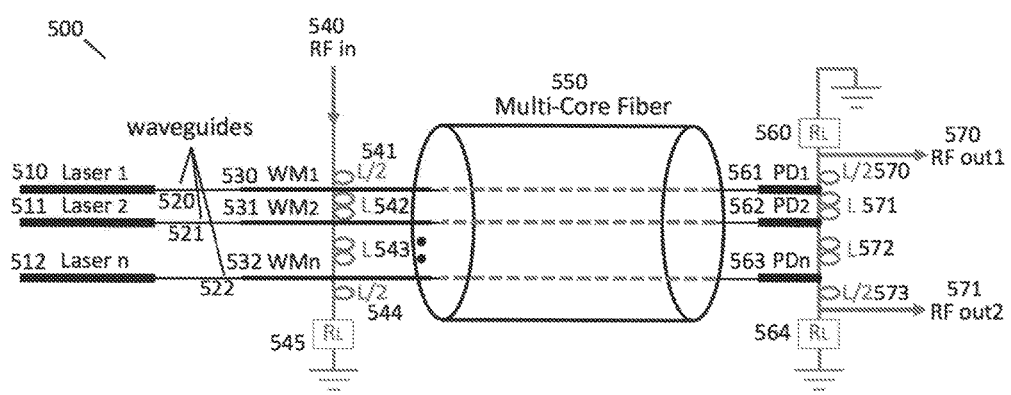
FIG. 5 The full array approach utilizing a multi-core optical fiber.

FIG. 5 shows an embodiment of a WAM based system similar to that in FIG. 3; in that case all lasers, waveguide optical modulators and an integrated array photodetector were within a single PIC, while in FIG. 5 the multiple outputs from the waveguide optical modulators are coupled into a multi-core fiber, the outputs of which are coupled into a separate and potentially remote, integrated array photodetector 500. In this embodiment N lasers 510, 511 and 512 are connected by waveguides 520, 521 and 522 to N waveguide optical modulators 530, 531 and 532. The RF input signal 540 is applied to the N waveguide optical modulators that are incorporated into an artificial transmission line through the series of inductors 541, 542, and 543, connected to the load resistance 545 through inductor 544. The N outputs from the waveguide optical modulators are coupled into a multi-core fiber 550 which includes at least N separate cores, the other end of which connects the N optical signals to N photodetectors 561, 562 and 563 within an integrated array photodetector. The array photodetector is itself arranged as an artificial transmission line with load resistors 560 and 564 at the ends of the transmission line, the transmission line itself being made up of the photodetectors which act mainly as capacitors, and inductors 570, 571, 572 and 573 which match the capacitances of the photodetectors to make up the artificial transmission line. RF outputs can be taken from across the two load resistors 560 and 564, providing RF output 1; 570 and RF output 2; 571.

Figure 6:
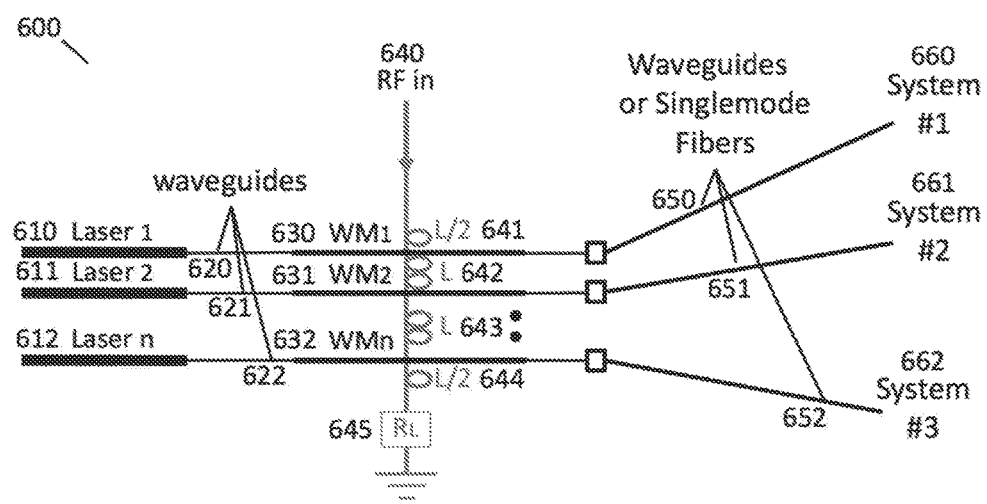
FIG. 6 A laser array plus waveguide array modulator (WAM) providing inputs to multiple optical systems.

FIG. 6 shows an embodiment of a WAM based system in which multiple laser input signals are modulated by the same RF input signal in an array of waveguide optical modulators, the outputs of the waveguide optical modulators going to a separate system or subsystem by passing through individual waveguides or singlemode fibers 600. In this embodiment N lasers 610, 611 and 612 are connected by waveguides 620, 621 and 622 to N waveguide optical modulators 630, 631 and 632. The RF input signal 640 is applied to the N waveguide optical modulators that are incorporated into an artificial transmission line through the series of inductors 641, 642, and 643, connected to the load resistance 645 through inductor 644. The N outputs from the waveguide optical modulators are coupled into N optical waveguides or singlemode fibers 650, 651 and 652, which provide the N modulated outputs to N separate systems 660, 661 and 662. Alternatively, more than one of the modulated outputs can go to a single system, or subsystem, in which case the WAM supports less than N separate systems.

Figure 7A:
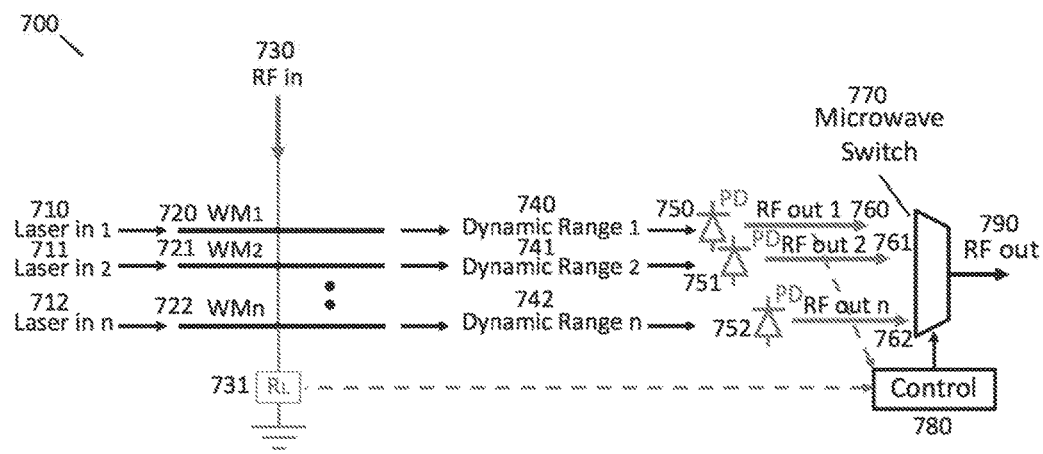
FIG. 7A A system with improved dynamic range through the use of multiple links, each link supporting a different dynamic range.

FIG. 7 shows an embodiment of a WAM based system in which the N waveguide optical modulators have different dynamic ranges 700, e.g. for N=2 a highly efficient modulator plus a low efficiency modulator with high dynamic range, both modulators being driven by the same RF input signal. The last part of the system chooses which of the two analog RF outputs to use as a system RF output, depending on the size of the RF input signal, providing a system RF output with extended SFDR. This can be accomplished by choosing one of multiple analog RF outputs with a microwave switch, as shown in FIG. 7A, or by digitizing the multiple analog signals and processing those signals digitally to provide a single higher dynamic range/higher number of bits output, as in FIG. 8.

In FIG. 7A, N lasers 710, 711 and 712 are connected to N waveguide optical modulators 720, 721 and 722. The RF input signal 730 is applied to the N waveguide optical modulators (either with or without inductors creating an artificial transmission line—shown without in FIG. 7A) and the load resistance 731. The N outputs from the waveguide optical modulators each have a different dynamic range version of the RF input signal 740, 741 and 742; each of these outputs passes into one of N single, high-power, photodetectors 750, 751 and 752, which convert the optical signal into N analog RF output signals 760, 761 and 762. The N analog RF output signals go in to a microwave switch 770, which chooses the optimum system RF output 790, based on a signal from a control loop 780. The control loop 780 monitors either the average electrical power from the RF input signal at the WAM load resistor 731, or the average RF electrical powers from the photodetectors 750, 751 and 752, in order to choose the optimum analog RF output signal to use for the system RF output 790.

Figure 7B:
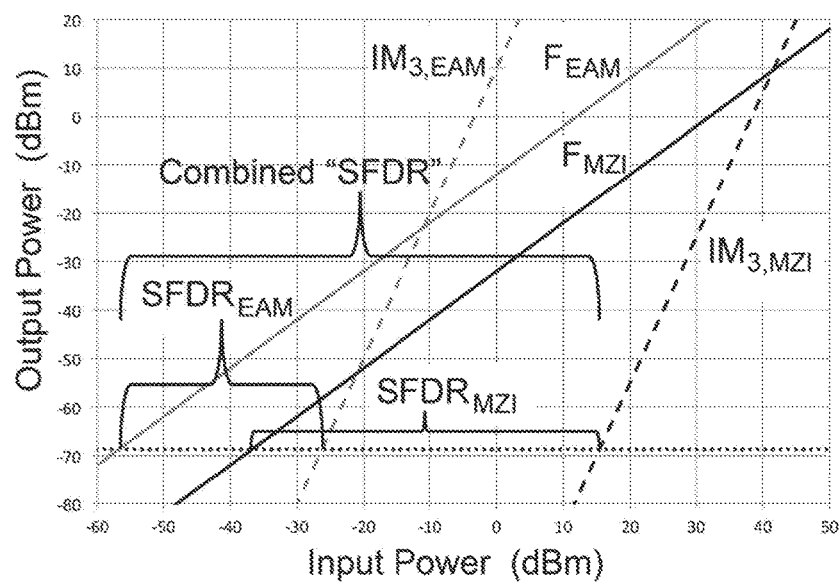
FIG. 7B A schematic showing the operating principle of a dual channel WAM system incorporating a high efficiency EAM for low level signals and a low efficiency MZI modulator for high level signals, demonstrating the much higher linearity of the combined system "SFDR".

FIG. 7B is a schematic plot showing how the dynamic range/SFDR for multiple waveguide optical modulators can be combined to provide an overall system output with extended dynamic range/SFDR. In this example, a highly efficient electroabsorption modulator (EAM) provides the low end of the dynamic range for very small RF input power levels, while a far less efficient Mach-Zehnder interferometer (MZI) modulator that also has a high dynamic range/SFDR provides the high end of the dynamic range for large RF input power levels. It can be seen from the plot that if the two SFDR ranges from the two modulator types can be combined to provide an extended SFDR, then this WAM based system can provide a significantly larger SFDR than any single modulator alone. The low end and high end dynamic ranges can be combined through a feedback loop and a microwave switch, as in FIG. 7A, or through digital techniques as in FIG. 8.

Figure 8:
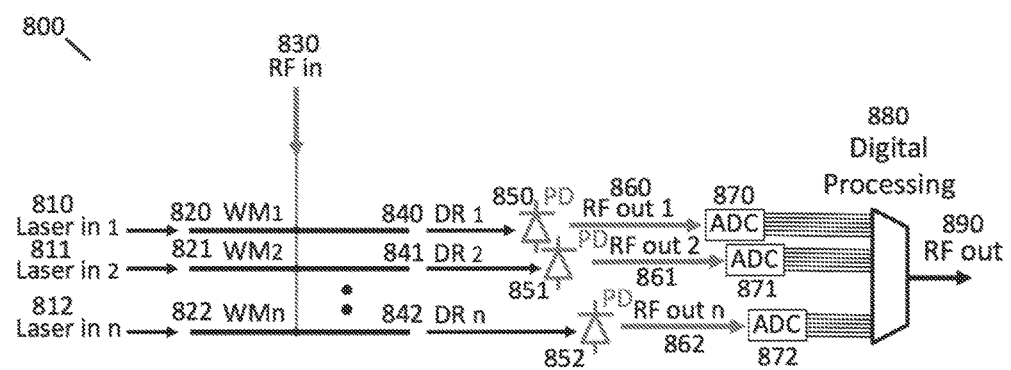
FIG. 8 A system with improved dynamic range through the use of multiple links and digital processing following analog to digital converters (ADCs) for each link.

FIG. 8 shows an embodiment of the extended SFDR system that utilizes analog-to-digital converters (ADCs) to provide the outputs from different modulator types, plus digital signal processing to combine those outputs to provide a single extended SFDR signal with a larger number of bits 800. In FIG. 8, N lasers 810, 811 and 812 are connected to N waveguide optical modulators 820, 821 and 822. The RF input signal 830 is applied to the N waveguide optical modulators (either with or without inductors creating an artificial transmission line—shown without in FIG. 8). The N outputs from the waveguide optical modulators each have a different dynamic range version of the RF input signal 840, 841 and 842; each of these N outputs has its own single, high-power, photodetector 850, 851 and 852, which convert the optical signals into N analog RF output signals 860, 861 and 862. The N analog RF output signals are converted to N digital signals through N ADCs 870, 871 and 872, which pass into a digital signal processor (DSP) 880, which provides a single higher SFDR system output with a higher number of bits than each of the previous ADCs; this is accomplished by scaling each of the N digital signals from the different waveguide optical modulators, and then combining them to provide the correct extended SFDR output.

Figure 9:
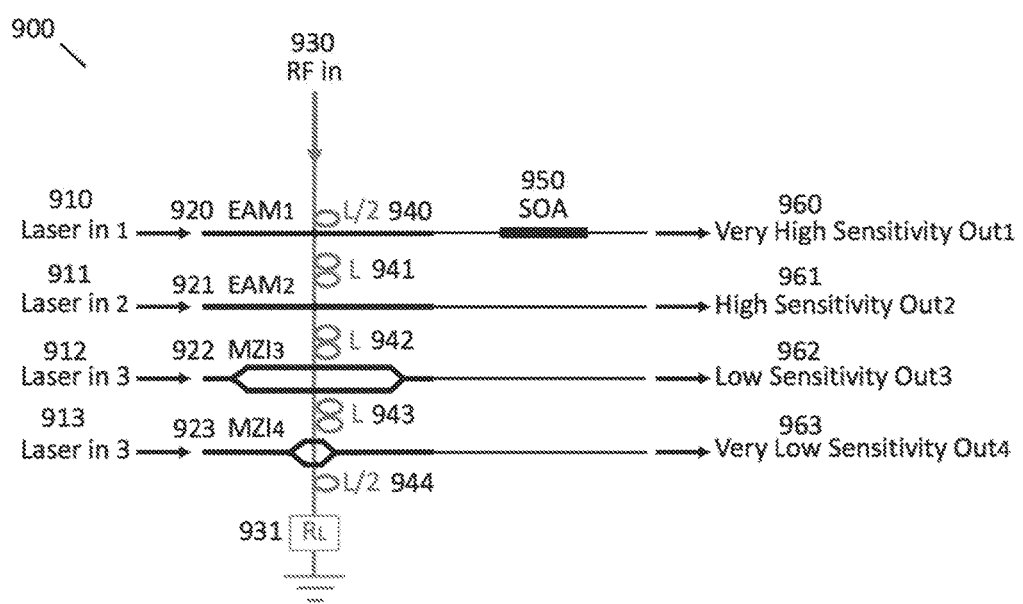
FIG. 9 An example with 4 modulators plus a semiconductor optical amplifier (SOA) in a WAM device; a very high sensitivity channel with an EAM and SOA, a high sensitivity channel with an EAM, a more linear channel with low sensitivity from a standard MZI modulator, and a more linear channel with very low sensitivity from a very low sensitivity (e.g. short phase modulation electrode or low $\delta n/\delta V$ design) MZI modulator.

FIG. 9 shows an embodiment of a WAM device for extended SFDR operation that includes a range of modulator types, varying from a very high sensitivity channel to a very low sensitivity channel with high linearity 900. This WAM device could be used in either the switched analog system shown in FIG. 7A or the digital system shown in FIG. 8. In the embodiment in FIG. 9 there are four lasers 910, 911, 912 and 913 feeding into four waveguide optical modulators; there could be more or less lasers and modulators in this system. Each of the four waveguide optical modulators has a different dynamic range, the first includes an EAM 920 followed by a semiconductor optical amplifier (SOA) 950 providing a very high sensitivity modulated output. The second waveguide optical modulator is an EAM 921, providing a high sensitivity output. The third waveguide optical modulator is an MZI modulator 922 providing a low sensitivity output with good dynamic range. The fourth waveguide optical modulator is a low sensitivity version of an MZI modulator 923 providing a very low sensitivity output with high linearity for high signal levels. The RF input signal 930 is applied to the N waveguide optical modulators that are incorporated into an artificial transmission line through the series of inductors 940, 941, 942, and 943, connected to the load resistance 931 through inductor 944.

Figure 10:
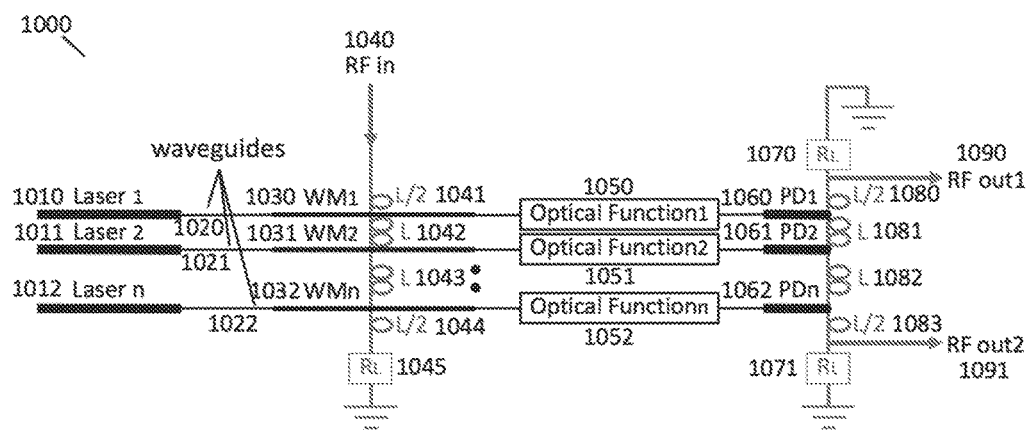
FIG. 10 A system including one or more optical function within each of the multiple links, e.g. filtering, time delay, switching, amplification, and optical down-conversion/up-conversion.

FIG. 10 shows an embodiment of a WAM based system in which multiple laser signals are modulated by multiple waveguide optical modulators using the same RF input signal, then the outputs of the different waveguide optical modulators pass through an optical function before passing into an integrated array photodetector which combines these different signals 1000. In this embodiment, the optical function could be an optical down-converter, which converts the RF input signal down to baseband, making it easier to digitally sample the signal with a high effective number of bits (ENOB). The system shown in FIG. 10 uses multiple lasers and waveguide optical modulators, each passing through the optical function, to provide a high optical power at the integrated array photodetector, in order to provide a high system SFDR. In FIG. 10, N lasers 1010, 1011 and 1012 are connected by waveguides 1020, 1021 and 1022 to N waveguide optical modulators 1030, 1031 and 1032. The RF input signal 1040 is applied to the N waveguide optical modulators that are incorporated into an artificial transmission line through the series of inductors 1041, 1042, and 1043, connected to the load resistance 1045 through inductor 1044. The N outputs from the waveguide optical modulators are coupled into N optical functions 1050, 1051 and 1052, the outputs of which connect the N optical signals to N photodetectors 1060, 1061 and 1062 within an integrated array photodetector. The array photodetector is itself arranged as an artificial transmission line with load resistors 1070 and 1071 at the ends of the transmission line, the transmission line itself being made up of the photodetectors which act mainly as capacitors, and inductors 1080, 1081, 1082 and 1083 which match the capacitances of the photodetectors to make up the artificial transmission line. RF outputs can be taken from across the two load resistors 1070 and 1071, providing RF output 1; 1090 and RF output 2; 1091. [48]

Although the drawings illustrate devices and systems with a limited number of optical modulators, the invention comprises other versions of the similar devices with N modulators, N≥2.

Although several exemplary embodiments have been herein shown and described, those of skill in the art will recognize that many modifications and variations are possible without departing from the spirit and scope of the invention, and it is intended to measure the invention only by the appended claims.

What is claimed is:

1. An optical device comprising:
a single electrical input signal entering N waveguide optical modulators, where N≥2, connected electrically in series while optically in parallel, each waveguide optical modulator having a separate optical input and a separate modulated optical output proportional to and driven by the single electrical input signal, each optical input being from a different laser, all waveguide optical modulator electrical inputs having the same voltage;
wherein the electrical input signal is connected to the N waveguide optical modulators through a series of inductors, inductance values of the inductors are chosen to match a capacitance C of a corresponding waveguide optical modulator in order to produce an artificial transmission line of an impedance Z, using inductor values L, and L/2 at the ends of the transmission line, where Z=sqrt(L/C); the optical device has a speed of a single waveguide optical modulator.

2. The device of claim 1, wherein the N separate optical outputs of the N waveguide optical modulators are combined in an array photodetector device, providing an electrical output signal from the array photodetector device than is N times larger than a signal obtained from a single waveguide optical modulator and single photodetector device.

3. The device of claim 1, wherein each of N separate optical inputs to the N waveguide optical modulators have a different wavelength; the N separate optical outputs of the N waveguide optical modulators are combined in a wavelength division multiplexor, providing a combined optical output that is N times larger than obtained from a single waveguide optical modulator minus a loss of the wavelength division multiplexor.

4. The device of claim 1, wherein an output from a single high power laser is split into N optical signals entering the N separate optical inputs to N waveguide optical modulators; the outputs of the N waveguide optical modulators pass through phase shifters to control their optical phase, after which they are coherently combined to provide a single high power modulated signal; that modulated optical signal having a N times larger optical power level than the same from a single waveguide optical modulator minus the excess loss of the splitter and combiner.

5. The device of claim 1, wherein an output power from each waveguide optical modulator is provided to a different optical system, or different parts of a single optical system.

6. The device of claim 1, wherein each separate waveguide optical modulator has a different dynamic range, the outputs of each of the waveguide optical modulators are converted to electrical signals by photodetectors, each photodetector output signal having a different dynamic range, and one of these photodetector output signals is chosen as an overall system output, depending on a size of the electrical input signal; providing the system with a larger dynamic range than that of a single waveguide optical modulator and photodetector, by including the dynamic ranges of each waveguide optical modulator and associated photodetectors within the overall system output.

7. The device of claim 6, wherein at least one of the waveguide optical modulators is a high sensitivity modulator being an electroabsorption modulator (EAM) or a microring resonator based modulator (MRM); and/or at least one of the modulators is a very high sensitivity modulator being an EAM or MRM plus a semiconductor optical amplifier (SOA); and/or at least one of the modulators supports a lower sensitivity but higher linearity link, being a Mach Zehnder Interferometer (MZI) modulator; and/or at least one of the modulators supports a very low sensitivity and high linearity at a high electrical signal level, being a low efficiency MZI modulator.

8. The device of claim 7, wherein the optical outputs of each waveguide optical modulator are converted to electrical signals by photodetectors and an analog electrical signal from one of these photodetectors is chosen by an electrical switch to provide a system output.

9. The device of claim 8, wherein a choice of the analog electrical signal is made by monitoring an average electrical power of the electrical signals from the photodetectors into their load resistors, and choosing an appropriate analog electric signal, including small signal, medium signal or large signal, based on average signal power levels (small, medium or large) in the load resisters.

10. The device of claim 8, wherein a choice of the analog electrical signal is made by monitoring an average electrical power of the signal driving the waveguide array modulator in a waveguide array modulator load resistor, and choosing an appropriate analog electric signal, including small signal, medium signal or large signal, based on an average signal power level (small, medium or large) in the waveguide array modulator load resister.

11. The device of claim 8, where the optical outputs of each waveguide optical modulator are converted to electrical signals by photodetectors, which are then converted to digital signals by analog to digital converters; these multiple digital signals with different dynamic ranges are then combined digitally by calculating a digital output signal that has a higher number of digital bits and higher dynamic range than the digital signals from each separate converter.

12. The optical device of claim 1, wherein each of the waveguide optical modulators is from a group of waveguide optical modulators, consisting of an electro-absorption modulator, a phase modulator, an amplitude modulator, an intensity modulator based on a Mach-Zehnder Interferometer (MZI), a microring resonator based modulator (MRM).

13. The optical device of claim 1, wherein the modulators include semiconductor waveguide devices utilizing bulk, multiple quantum well (MQW), quantum dash and quantum dot materials, hybrid waveguides such as III-V semiconductors heterogeneously integrated onto silicon waveguides, polymer waveguide modulators, and materials that include single atomic layers of graphene, and transition metal dichalcogenides (TMDC).

14. The optical device of claim 13, further comprising a semiconductor optical amplifier (SOA) placed after one of the waveguide optical modulators to increase a sensitivity of this waveguide optical modulator.

15. An optical device comprising:
a single electrical input signal entering N waveguide optical modulators, where N≥2, connected electrically in series while optically in parallel, each waveguide optical modulator having a separate optical input and a separate modulated optical output proportional to and driven by the single electrical input signal, each optical input being from a different laser, all waveguide optical modulator electrical inputs having the same voltage; further comprising
a series of N separate lasers outputting N laser beams entering optical inputs of the N modulators.

16. The device of claim 15, wherein each of the N lasers have different wavelength.

17. The device of claim 16, wherein the N separate optical outputs of the N waveguide optical modulators are combined in a wavelength division multiplexor, providing a combined optical output that is N times larger than obtained from a single waveguide optical modulator minus a loss of the wavelength division multiplexor.

18. The device of claim 15, wherein the N separate optical outputs of the N waveguide optical modulators are combined in an array photodetector device, providing an electrical output signal from the array photodetector device that is N times larger than a signal obtained from a single laser, a single waveguide optical modulator and single photodetector device.

19. The device of claim 15, wherein an output power from each waveguide optical modulator is provided to a different optical system, or different parts of a single optical system.

20. The device of claim 15, wherein each separate waveguide optical modulator has a different dynamic range, the outputs of each of the waveguide optical modulators are converted to electrical signals by photodetectors, each photodetector output signal having a different dynamic range, and one of these photodetector output signals is chosen as an overall system output, depending on a size of the electrical input signal; providing the system with a larger dynamic range than that of a single waveguide optical modulator and photodetector, by including the dynamic ranges of each waveguide modulator and associated photodetectors within the overall system output.

* * * * *